(12) United States Patent
Ko

(10) Patent No.: US 9,548,100 B2
(45) Date of Patent: Jan. 17, 2017

(54) SEMICONDUCTOR MEMORY APPARATUS PERFORMING A REFRESH OPERATION

(71) Applicant: SK hynix Inc., Icheon-si, Gyeonggi-do (KR)

(72) Inventor: Jae Bum Ko, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 37 days.

(21) Appl. No.: 14/515,821

(22) Filed: Oct. 16, 2014

(65) Prior Publication Data
US 2016/0005456 A1   Jan. 7, 2016

(30) Foreign Application Priority Data

Jul. 3, 2014 (KR) .................. 10-2014-0083176

(51) Int. Cl.
| | |
|---|---|
| *G11C 7/10* | (2006.01) |
| *G11C 11/406* | (2006.01) |
| *G11C 11/408* | (2006.01) |
| *G11C 8/12* | (2006.01) |
| *G11C 8/18* | (2006.01) |

(52) U.S. Cl.
CPC ............ *G11C 11/40611* (2013.01); *G11C 8/12* (2013.01); *G11C 11/4087* (2013.01); *G11C 11/40618* (2013.01); *G11C 8/18* (2013.01)

(58) Field of Classification Search
CPC ........... G11C 11/40611; G11C 11/4087; G11C 11/40622; G11C 11/40615; G11C 7/10; G11C 7/00

USPC ...................................................... 365/189.05
See application file for complete search history.

(56) References Cited

U.S. PATENT DOCUMENTS

| | | | |
|---|---|---|---|
| 8,854,910 B2* | 10/2014 | Park ................. | G11C 11/40615 365/222 |
| 2013/0051157 A1* | 2/2013 | Park ................. | G11C 11/40622 365/189.05 |
| 2014/0304462 A1* | 10/2014 | Venugopal ............... | G11C 8/12 711/104 |

FOREIGN PATENT DOCUMENTS

| | | |
|---|---|---|
| KR | 1019990023069 A | 3/1999 |
| KR | 1020050014138 A | 2/2005 |

* cited by examiner

*Primary Examiner* — Han Yang
*Assistant Examiner* — Xiaochun L Chen
(74) *Attorney, Agent, or Firm* — William Park & Associates Ltd.

(57) ABSTRACT

A semiconductor memory apparatus may include a refresh mode control circuit configured to enable a row address increase signal when all banks capable of being designated by a bank address in a refresh operation are all designated. The semiconductor memory apparatus may also include and a row address generation circuit configured to increase a value of a row address when the row address increase signal is enabled.

19 Claims, 10 Drawing Sheets

FIG.9
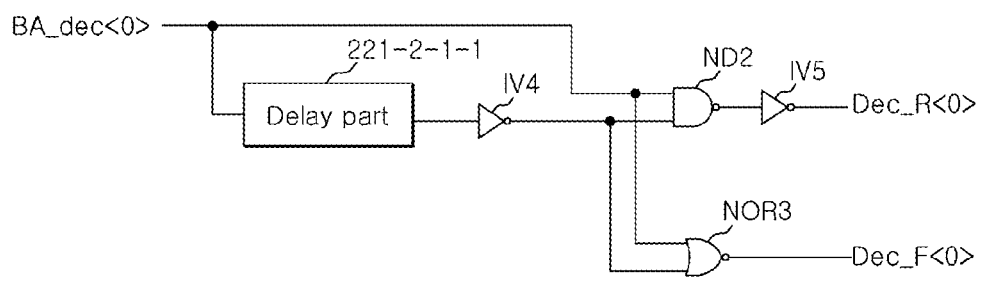
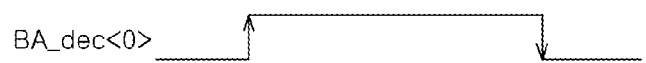
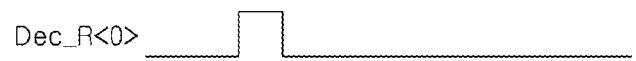

US 9,548,100 B2

SEMICONDUCTOR MEMORY APPARATUS PERFORMING A REFRESH OPERATION

CROSS-REFERENCES TO RELATED APPLICATION

The present application claims priority under 35 U.S.C. §119(a) to Korean application number 10-2014-0083176, filed on Jul. 3, 2014, in the Korean Intellectual Property Office, which is incorporated herein by reference in its entirety.

BACKGROUND

1. Technical Field

Various embodiments generally relate to semiconductor integrated circuits, and more particularly, to a semiconductor memory apparatuses.

2. Related Art

Semiconductor memory apparatuses are configured to store data. The data stored in the semiconductor memory apparatuses may also be outputted to other devices located externally from the semiconductor memory apparatus. Depending on the type of scheme used for storing data, semiconductor memory apparatuses may be classified into volatile memory or nonvolatile memory. Volatile memory must perform an operation for retaining data and nonvolatile memory does not need to perform the operation for retaining data.

The semiconductor memory apparatuses that include volatile memory retain their data by performing a refresh operation.

The development of a refresh operation for allowing a semiconductor memory apparatus to stably retain data is in progress.

SUMMARY

In an embodiment, a semiconductor memory apparatus may include a refresh mode selection circuit configured to generate a first refresh mode signal and a second refresh mode signal in response to an external command and a refresh control signal. The semiconductor memory apparatus may also include a first refresh mode control circuit configured to generate a first row address increase signal in response to a bank address and the first refresh mode signal, and a second refresh mode control circuit configured to generate a second row address increase signal in response to the second refresh mode signal. The semiconductor memory apparatus may also include a row address generation circuit configured to generate a row address in response to the first and second row address increase signals, wherein the first refresh mode control circuit enables the first row address increase signal after all preset banks to be designated by the bank address are activated, when the first refresh mode signal is enabled.

In an embodiment, a semiconductor memory apparatus may include a refresh mode control circuit configured to enable a row address increase signal when all banks capable of being designated by a bank address in a refresh operation are all designated. The semiconductor memory apparatus may also include and a row address generation circuit configured to increase a value of a row address when the row address increase signal is enabled.

In an embodiment, a semiconductor memory apparatus may include a decoding block configured for receiving an external command and outputting a refresh signal, and a selective output block configured for receiving the refresh signal and a refresh control signal and outputting a first refresh mode signal and a second refresh mode signal. Also, when the external command is a refresh command and the refresh control signal is enabled the first refresh mode signal may be enabled placing the semiconductor memory apparatus in a single bank refresh mode. Additionally, in the single bank refresh mode a refresh operation may be performed for a row address of a bank designated by a bank address and the refresh operation may be performed again for another row address after increasing the row address.

BRIEF DESCRIPTION OF THE DRAWINGS

FIG. 9 is a configuration diagram of a representation of the first pulse generating section illustrated in FIG. 7.

DETAILED DESCRIPTION

Hereinafter, a semiconductor memory apparatus will be described below with reference to the accompanying drawings through various examples of embodiments.

Figure 1:
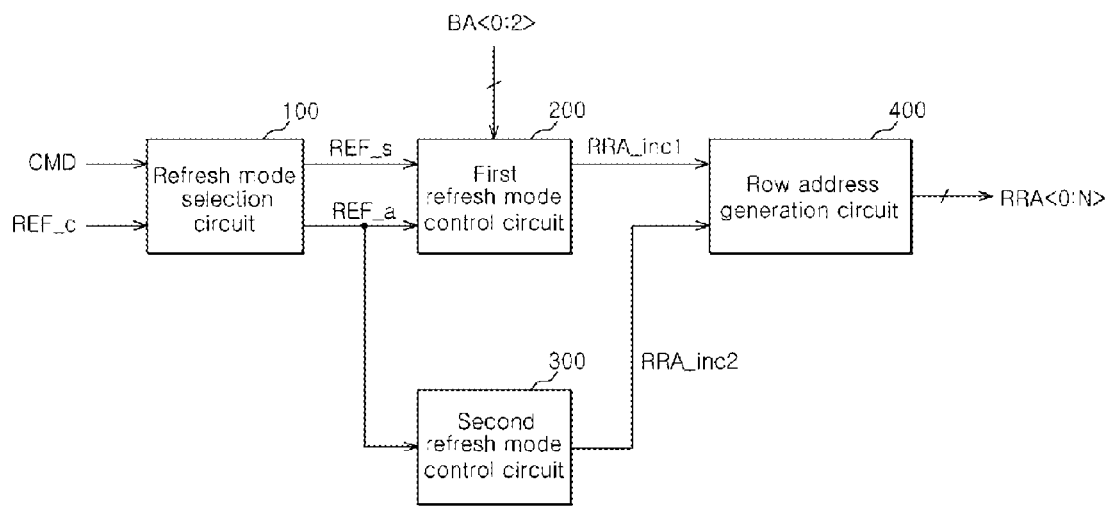
FIG. 1 is a configuration diagram of a representation of a semiconductor memory apparatus in accordance with an embodiment.

As illustrated in FIG. 1, a semiconductor memory apparatus in accordance with an embodiment may include a refresh mode selection circuit 100, a first refresh mode control circuit 200, a second refresh mode control circuit 300, and a row address generation circuit 400.

The refresh mode selection circuit 100 may generate a first refresh mode signal REF_s and a second refresh mode signal REF_a in response to an external command CMD and a refresh control signal REF_c. For example, the refresh mode selection circuit 100 enables the first refresh mode signal REF_s when the external command CMD is a refresh command and the refresh control signal REF_c is enabled (i.e., at a predetermined level). The refresh mode selection circuit 100 may enable the second refresh mode signal REF_a when the external command CMD is a refresh command and the refresh control signal REF_c is disabled. If the first refresh mode signal REF_s is enabled, the semiconductor memory apparatus may be in a single bank refresh mode whereby a refresh operation is performed for a bank designated by a bank address BA<0:2>. If the second refresh mode signal REF_a is enabled, the semiconductor memory apparatus may be in an all bank refresh mode whereby the refresh operations are performed simultaneously or substantially simultaneously for all banks. When the semiconductor memory apparatus is in the single bank refresh mode, a refresh operation may be performed for a row address of a bank designated by the bank address BA<0:2> and refresh operations may be performed for the same row addresses of all banks, and thereafter, a refresh operation may be performed again by increasing a row address. When the semiconductor memory apparatus is in the all bank refresh mode, refresh operations may be performed simultaneously or substantially simultaneously for all banks.

The first refresh mode control circuit 200 may generate a first row address increase signal RRA_inc1 in response to the bank address BA<0:2> and the first refresh mode signal REF_s. For example, the first refresh mode control circuit 200 enables the first row address increase signal RRA_inc1 after all preset banks to be designated by the bank address BA<0:2> are activated, when the first refresh mode signal REF_s is enabled. The bank address BA<0:2> which is described as an example may designate 8 banks. Therefore, the first refresh mode control circuit 200 which is illustrated in FIG. 1 as an example enables the first row address increase signal RRA_inc1 when all 8 banks capable of being designated by the bank address BA<0:2> are activated. The first refresh mode control circuit 200 is initialized when the second refresh mode signal REF_a is enabled.

The second refresh mode control circuit 300 may enable a second row address increase signal RRA_inc2 when the second refresh mode signal REF_a is enabled.

The row address generation circuit 400 may increase the value of a row address RRA<0:N> when one of the first and second row address increase signals RRA_inc1 and RRA_inc2 is enabled (i.e., where N is a natural number).

Figure 2:
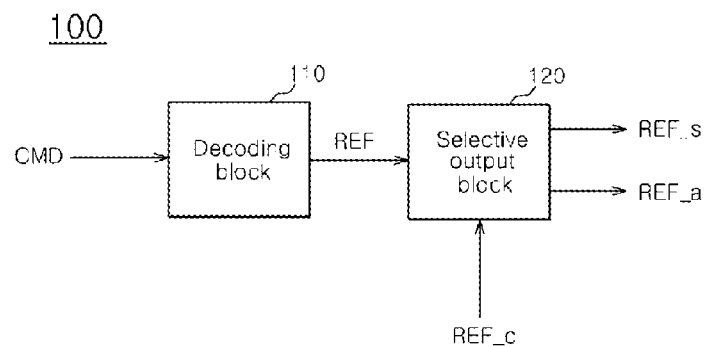
FIG. 2 is a configuration diagram of a representation of the refresh mode selection circuit illustrated in FIG. 1.

Referring to FIG. 2, the refresh mode selection circuit 100 may include a decoding block 110 and a selective output block 120.

The decoding block 110 may decode the external command CMD, and enable a refresh signal REF when the external command CMD is a refresh command.

The selective output block 120 may output the enabled refresh signal REF as one of the first and second refresh mode signals REF_s and REF_a in response to the refresh control signal REF_c. For example, the selective output block 120 outputs the enabled refresh signal REF as the first refresh mode signal REF_s when the refresh control signal REF_c is enabled. For example, the selective output block 120 outputs the enabled refresh signal REF as the second refresh mode signal REF_a when the refresh control signal REF_c is disabled. The selective output block 120 may include a demultiplexer.

Figure 3:
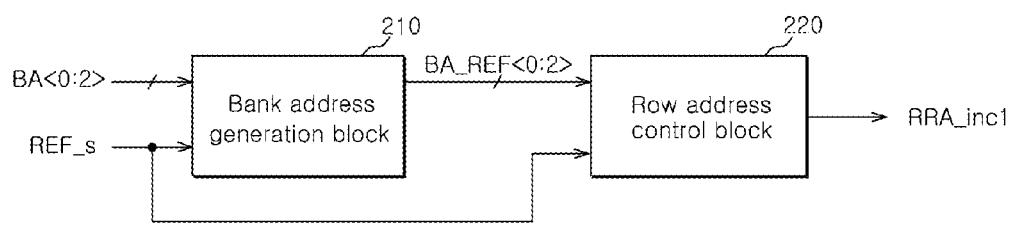
FIG. 3 is a configuration diagram of a representation of the first refresh mode control circuit illustrated in FIG. 1.

Referring to FIG. 3, the first refresh mode control circuit 200 may include a bank address generation block 210 and a row address control block 220.

Figure 4:
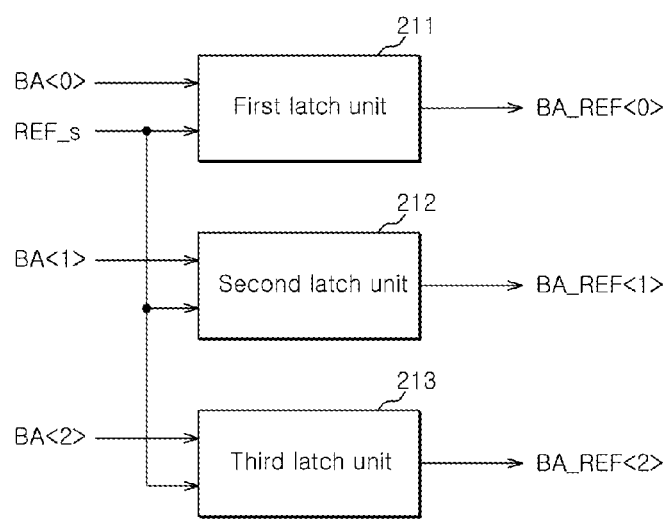
FIG. 4 is a configuration diagram of a representation of the bank address generation block illustrated in FIG. 3.

The bank address generation block 210 may latch the bank address BA<0:2> when the first refresh mode signal REF_s is enabled, and output the latched bank address BA<0:2> as a bank address BA_REF<0:2>. For example, the bank address generation block 210 may include a plurality of latch units which latch the respective bits of the bank address BA<0:2> when the first refresh mode signal REF_s is enabled and output the respective bits of the bank address BA_REF<0:2>. As illustrated in FIG. 4, the bank address generation block 210 may include first to third latch units 211 to 213.

The first latch unit 211 may latch the first bit BA<0> of the bank address BA<0:2> when the first refresh mode signal REF_s is enabled, and output the first bit BA_REF<0> of the bank address BA_REF<0:2>.

The second latch unit 212 may latch the second bit BA<1> of the bank address BA<0:2> when the first refresh mode signal REF_s is enabled, and output the second bit BA_REF<1> of the bank address BA_REF<0:2>.

The third latch unit 213 may latch the third bit BA<2> of the bank address BA<0:2> when the first refresh mode signal REF_s is enabled, and output the third bit BA_REF<2> of the bank address BA_REF<0:2>.

Referring to FIG. 3, the row address control block 220 may enable the first row address increase signal RRA_inc1 in the cases where the value of the bank address BA_REF<0:2> corresponds to all the values of a plurality of preset fixed codes F_c0<0:2> to F_c7<0:2> (see FIG. 5), when the first refresh mode signal REF_s is enabled.

Figure 5:
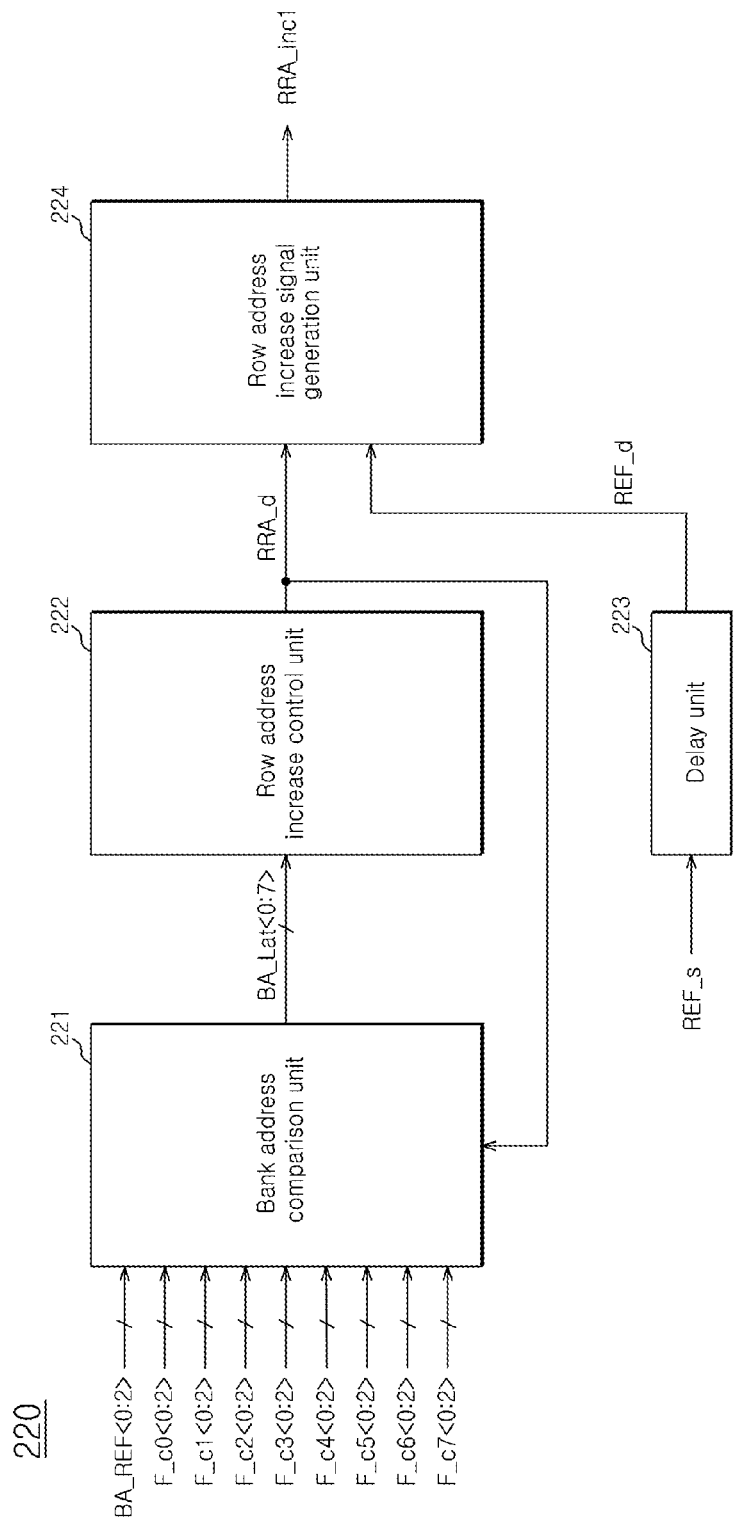
FIG. 5 is a configuration diagram of a representation of the row address control block illustrated in FIG. 3.

Referring to FIG. 5, the row address control block 220 may include a bank address comparison unit 221, a row address increase control unit 222, a delay unit 223, and a row address increase signal generation unit 224.

The bank address comparison unit 221 may determine whether the values of the bank address BA_REF<0:2> and first to eighth fixed codes F_c0<0:2>, F_c1<0:2>, F_c2<0:2>, F_c3<0:2>, F_c4<0:2>, F_c5<0:2>, F_c6<0:2> and F_c7<0:2> which have preset code values are the same. The bank address comparison unit 221 may generate first to eighth bank address latch signals BA_Lat<0:7>. For example, the bank address comparison unit 221 enables, latches, and outputs a corresponding bank address latch signal among the first to eighth bank address latch signals BA_Lat<0:7> when the values of the bank address BA_REF<0:2> and the first to eighth fixed codes F_c0<0:2> to F_c7<0:2> are the same with each other. Also, the bank address comparison unit 221 disables all the first to eighth bank address latch signals BA_Lat<0:7> after all the first to eighth bank address latch signals BA_Lat<0:7> are enabled and then an address increase determination signal RRA_d is enabled. Further descriptions will be made below. It may be assumed for simplicity of explanation that the semiconductor memory apparatus in accordance with the embodiments include, for example but not limited to, 8 banks, and the 3-bit bank address BA<0:2> capable of designating 8 banks will be described by way of example, without a limiting sense. Thus, more or less than 8 banks may be implemented with more or less than 3-bit bank addresses capable of designating the chosen number of banks. Referring now to FIG. 5, the first to eighth fixed codes F_c0<0:2> to F_c7<0:2> respectively correspond to 8 banks. The first fixed code F_c0<0:2> may have a value of 0,0,0. The second fixed code F_c1<0:2> may have a value of 0,0,1. The third fixed code F_c2<0:2> may have a value of 0,1,0. The fourth fixed code F_c3<0:2> may have a value of 0,1,1. The fifth fixed code F_c4<0:2> may have a value of 1,0,0. The sixth fixed code F_c5<0:2> may have a value of 1,0,1. The seventh fixed code F_c6<0:2> may have a value of 1,1,0. The eighth fixed code F_c7<0:2> may have a value of 1,1,1. For example, the bank address comparison unit 221 enables the first bank address latch signal BA_Lat<0> when the bank address BA_REF<0:2> and the first fixed code F_c0<0:2> are the same with each other, that is, when the bank address BA_REF<0:2> is 0,0,0. The bank address comparison unit 221 may enable the second bank address latch signal BA_Lat<1> when the bank address BA_REF<0:2> and the second fixed code F_c1<0:2> are the same with each other, that is, when the bank address BA_REF<0:2> is 0,0,1. The bank address comparison unit 221 may enable the third bank address latch signal BA_Lat<2> when the bank address BA_REF<0:2> and the third fixed code F_c2<0:2> are the same with each other, that is, when the bank address BA_REF<0:2> is 0,1,0. The bank address comparison unit 221 may enable the fourth bank address latch signal BA_Lat<3> when the bank address BA_REF<0:2> and the fourth fixed code F_c3<0:2> are the same with each other, that is, when the bank address BA_REF<0:2> is 0,1,1. The bank address comparison unit 221 may enable the fifth bank address latch signal BA_Lat<4> when the bank address BA_REF<0:2> and the fifth fixed code F_c4<0:2> are the same with each other, that is, when the bank address BA_REF<0:2> is 1,0,0. The bank address comparison unit 221 may enable the sixth bank address latch signal BA_Lat<5> when the bank address BA_REF<0:2> and the sixth fixed code F_c5<0:2> are the same with each other, that is, when the bank address BA_REF<0:2> is 1,0,1. The bank address comparison unit 221 may enable the seventh bank address latch signal BA_Lat<6> when the bank address BA_REF<0:2> and the seventh fixed code F_c6<0:2> are the same with each other, that is, when the bank address BA_REF<0:2> is 1,1,0. The bank address comparison unit 221 may enable the eighth bank address latch signal BA_Lat<7> when the bank address BA_REF<0:2> and the eighth fixed code F_c7<0:2> are the same with each other, that is, when the bank address BA_REF<0:2> is 1,1,1.

The row address increase control unit 222 may enable the address increase determination signal RRA_d when all of the first to eighth bank address latch signals BA_Lat<0:7> are enabled. The bank address comparison unit 221 may initialize, that is, disable, the first to eighth bank address latch signals BA_Lat<0:7> when the address increase determination signal RRA_d is enabled.

The delay unit 223 may delay the first refresh mode signal REF_s and output a delayed signal REF_d.

The row address increase signal generation unit 224 may enable the first row address increase signal RRA_inc1 when both the delayed signal REF_d and the address increase determination signal RRA_d are enabled.

Figure 6:
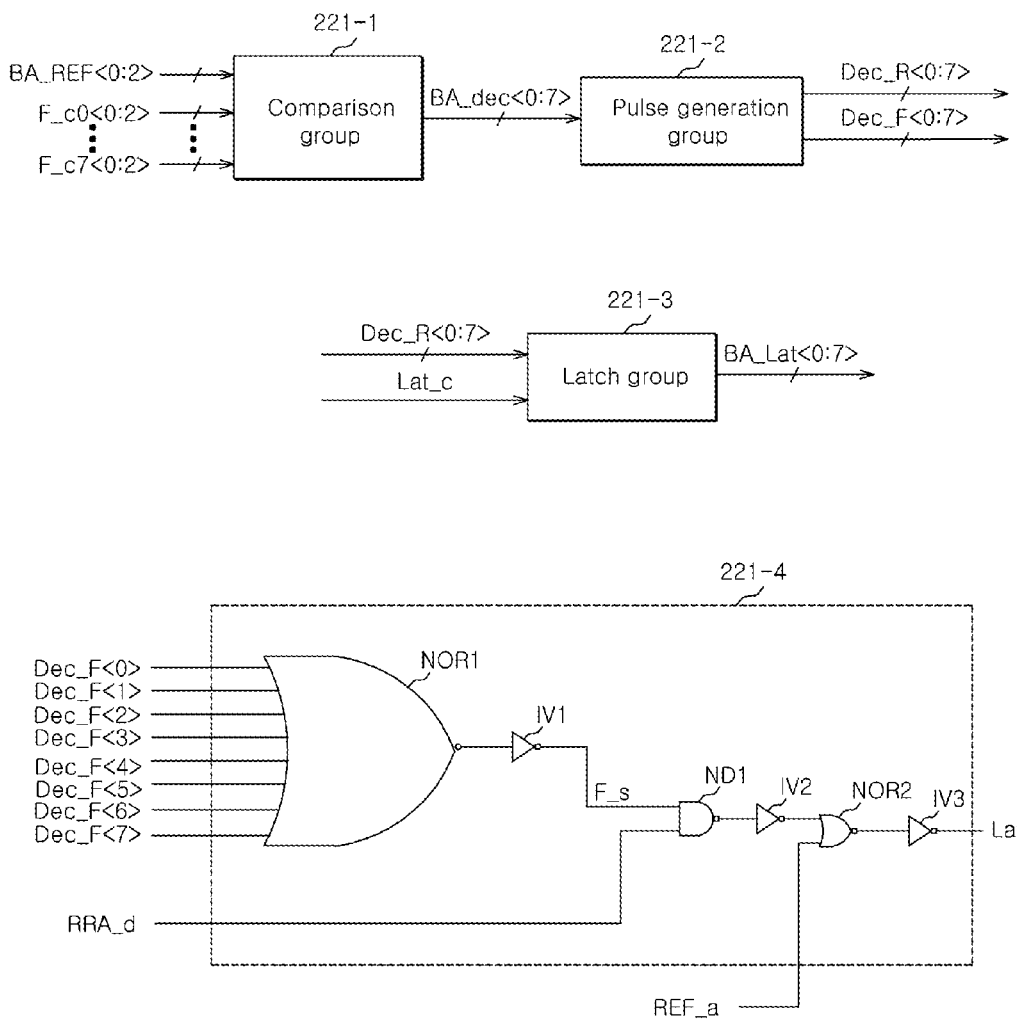
FIG. 6 is a configuration diagram of a representation of the bank address comparison unit illustrated in FIG. 5.

Referring to FIG. 6, the bank address comparison unit 221 may include a comparison group 221-1, a pulse generation group 221-2, a latch group 221-3, and a latch control section 221-4.

The comparison group 221-1 may compare the value of the bank address BA_REF<0:2> and the respective values of the first to eighth fixed codes F_c0<0:2> to F_c7<0:2>, and generate first to eighth bank detection signals BA_dec<0:7>.

Figure 7:
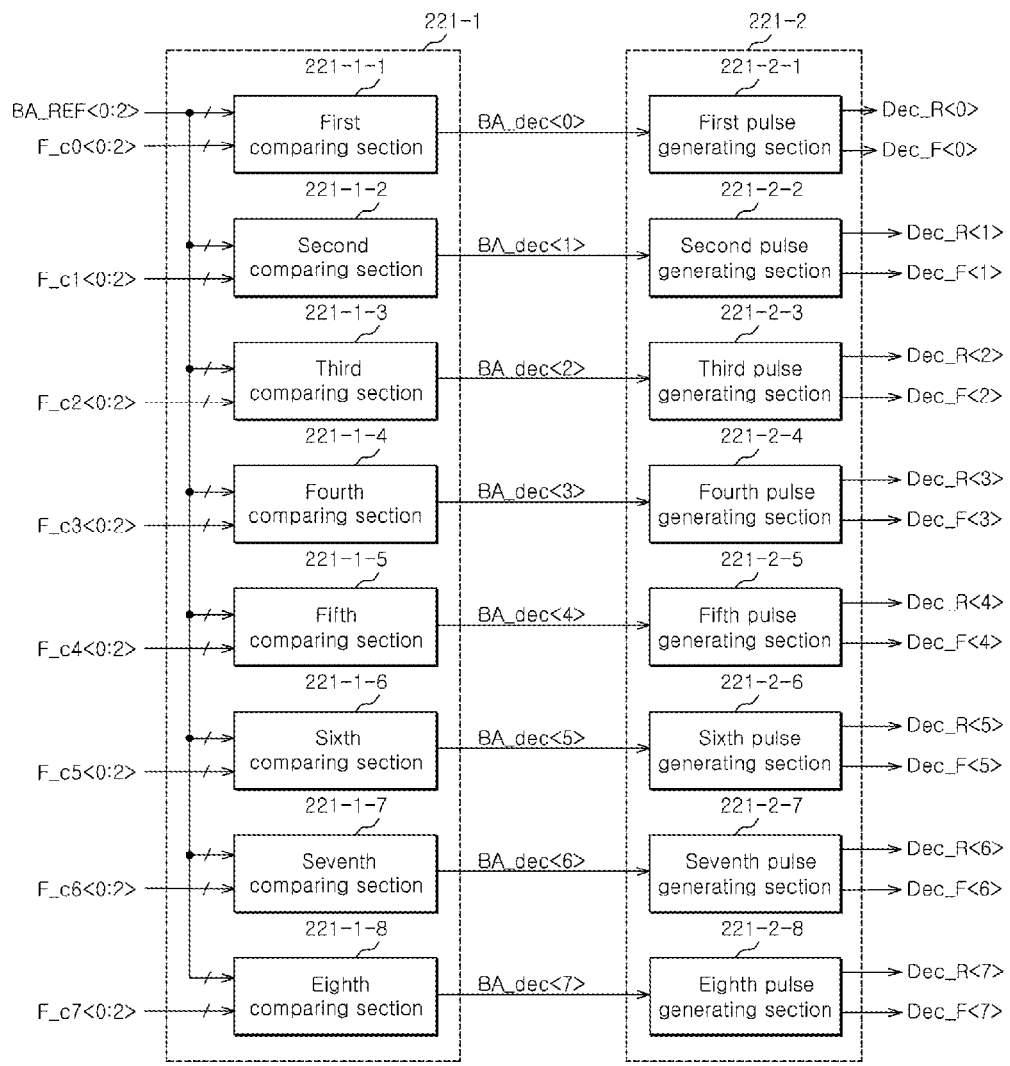
FIG. 7 is a configuration diagram of a representation of the comparison group and the pulse generation group illustrated in FIG. 6.

As illustrated in FIG. 7, the comparison group 221-1 may include first to eighth comparing sections 221-1-1, 221-1-2, 221-1-3, 221-1-4, 221-1-5, 221-1-6, 221-1-7 and 221-1-8.

The first comparing section 221-1-1 may enable the first bank detection signal BA_dec<0> when the bank address BA_REF<0:2> and the first fixed code F_c0<0:2> are the same with each other (i.e., the values of the bank address BA_REF<0:2> and the first fixed code F_c0<0:2> match each other).

The second comparing section 221-1-2 may enable the second bank detection signal BA_dec<1> when the bank address BA_REF<0:2> and the second fixed code F_c1<0:2> are the same with each other.

The third comparing section 221-1-3 may enable the third bank detection signal BA_dec<2> when the bank address BA_REF<0:2> and the third fixed code F_c2<0:2> are the same with each other.

The fourth comparing section 221-1-4 may enable the fourth bank detection signal BA_dec<3> when the bank address BA_REF<0:2> and the fourth fixed code F_c3<0:2> are the same with each other.

The fifth comparing section 221-1-5 may enable the fifth bank detection signal BA_dec<4> when the bank address BA_REF<0:2> and the fifth fixed code F_c4<0:2> are the same with each other.

The sixth comparing section 221-1-6 may enable the sixth bank detection signal BA_dec<5> when the bank address BA_REF<0:2> and the sixth fixed code F_c5<0:2> are the same with each other.

The seventh comparing section 221-1-7 may enable the seventh bank detection signal BA_dec<6> when the bank address BA_REF<0:2> and the seventh fixed code F_c6<0:2> are the same with each other.

The eighth comparing section 221-1-8 may enable the eighth bank detection signal BA_dec<7> when the bank address BA_REF<0:2> and the eighth fixed code F_c7<0:2> are the same with each other. The first to eighth comparing sections 221-1-1 to 221-1-8 may be configured by decoders.

The pulse generation group 221-2 (See FIGS. 6 and 7) may generate first to eighth rising pulses Dec_R<0:7> and first to eighth falling pulses Dec_F<0:7> at the rising edges and the falling edges of the respective first to eighth bank detection signals BA_dec<0:7>.

Referring to FIG. 7, the pulse generation group 221-2 may include first to eighth pulse generating sections 221-2-1, 221-2-2, 221-2-3, 221-2-4, 221-2-5, 221-2-6, 221-2-7 and 221-2-8.

The first pulse generating section 221-2-1 may generate the first rising pulse Dec_R<0> at the rising edge of the first bank detection signal BA_dec<0>. The first pulse generating section 221-2-1 may generate the first falling pulse Dec_F<0> at the falling edge of the first bank detection signal BA_dec<0>.

The second pulse generating section 221-2-2 may generate the second rising pulse Dec_R<1> at the rising edge of the second bank detection signal BA_dec<1>. The second pulse generating section 221-2-2 may generate the second falling pulse Dec_F<1> at the falling edge of the second bank detection signal BA_dec<1>.

The third pulse generating section 221-2-3 may generate the third rising pulse Dec_R<2> at the rising edge of the third bank detection signal BA_dec<2>. The third pulse generating section 221-2-3 may generate the third falling pulse Dec_F<2> at the falling edge of the third bank detection signal BA_dec<2>.

The fourth pulse generating section 221-2-4 may generate the fourth rising pulse Dec_R<3> at the rising edge of the fourth bank detection signal BA_dec<3>. The fourth pulse generating section 221-2-4 may generate the fourth falling pulse Dec_F<3> at the falling edge of the fourth bank detection signal BA_dec<3>.

The fifth pulse generating section 221-2-5 may generate the fifth rising pulse Dec_R<4> at the rising edge of the fifth bank detection signal BA_dec<4>. The fifth pulse generating section 221-2-5 may generate the fifth falling pulse Dec_F<4> at the falling edge of the fifth bank detection signal BA_dec<4>.

The sixth pulse generating section 221-2-6 may generate the sixth rising pulse Dec_R<5> at the rising edge of the sixth bank detection signal BA_dec<5>. The sixth pulse generating section 221-2-6 may generate the sixth falling pulse Dec_F<5> at the falling edge of the sixth bank detection signal BA_dec<5>.

The seventh pulse generating section 221-2-7 may generate the seventh rising pulse Dec_R<6> at the rising edge of the seventh bank detection signal BA_dec<6>. The seventh pulse generating section 221-2-7 may generate the seventh falling pulse Dec_F<6> at the falling edge of the seventh bank detection signal BA_dec<6>.

The eighth pulse generating section 221-2-8 may generate the eighth rising pulse Dec_R<7> at the rising edge of the eighth bank detection signal BA_dec<7>. The eighth pulse generating section 221-2-8 may generate the eighth falling pulse Dec_F<7> at the falling edge of the eighth bank detection signal BA_dec<7>.

The latch group 221-3 may latch the respective enable periods of the first to eighth rising pulses Dec_R<0:7> according to a latch control signal Lat_c and output the first to eighth bank address latch signals BA_Lat<0:7>. The latch group 221-3 may latch the enable periods of the first to eighth rising pulses Dec_R<0:7> and output the first to eighth bank address latch signals BA_Lat<0:7>, when the latch control signal Lat_c is disabled. The latch group 221-3 initializes, that is, disables, the values latched therein, when the latch control signal Lat_c is, for example, enabled.

Figure 8:
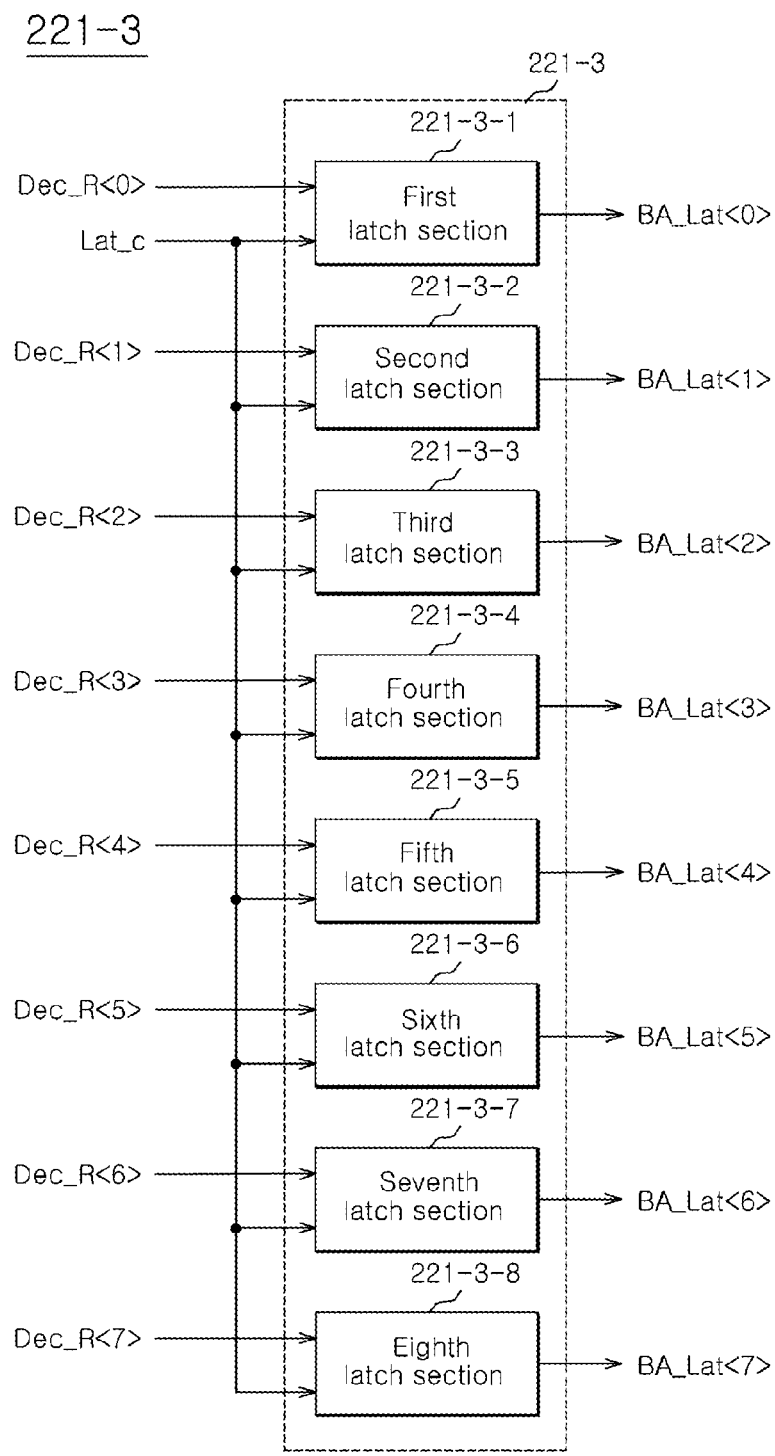
FIG. 8 is a configuration diagram of a representation of the latch group illustrated in FIG. 6.

Referring to FIG. 8, the latch group 221-3 may include first to eighth latch sections 221-3-1 to 221-3-8.

The first latch section 221-3-1 may enable the first bank address latch signal BA_Lat<0> when the latch control signal Lat_c is disabled and the first rising pulse Dec_R<0> is enabled, that is, becomes a high level, and retains the enabled state of the first bank address latch signal BA_Lat<0> until the latch control signal Lat_c is enabled.

The second latch section 221-3-2 may enable the second bank address latch signal BA_Lat<1> when the latch control signal Lat_c is disabled and the second rising pulse Dec_R<1> is enabled, that is, becomes a high level, and retains the enabled state of the second bank address latch signal BA_Lat<1> until the latch control signal Lat_c is enabled.

The third latch section 221-3-3 may enable the third bank address latch signal BA_Lat<2> when the latch control signal Lat_c is disabled and the third rising pulse Dec_R<2> is enabled, that is, becomes a high level, and retains the enabled state of the third bank address latch signal BA_Lat<2> until the latch control signal Lat_c is enabled.

The fourth latch section 221-3-4 may enable the fourth bank address latch signal BA_Lat<3> when the latch control signal Lat_c is disabled and the fourth rising pulse Dec_R<3> is enabled, that is, becomes a high level, and retains the enabled state of the fourth bank address latch signal BA_Lat<3> until the latch control signal Lat_c is enabled.

The fifth latch section 221-3-5 may enable the fifth bank address latch signal BA_Lat<4> when the latch control signal Lat_c is disabled and the fifth rising pulse Dec_R<4> is enabled, that is, becomes a high level, and retains the enabled state of the fifth bank address latch signal BA_Lat<4> until the latch control signal Lat_c is enabled.

The sixth latch section 221-3-6 may enable the sixth bank address latch signal BA_Lat<5> when the latch control signal Lat_c is disabled and the sixth rising pulse Dec_R<5> is enabled, that is, becomes a high level, and retains the enabled state of the sixth bank address latch signal BA_Lat<5> until the latch control signal Lat_c is enabled.

The seventh latch section 221-3-7 may enable the seventh bank address latch signal BA_Lat<6> when the latch control signal Lat_c is disabled and the seventh rising pulse Dec_R<6> is enabled, that is, becomes a high level, and retains the enabled state of the seventh bank address latch signal BA_Lat<6> until the latch control signal Lat_c is enabled.

The eighth latch section 221-3-8 may enable the eighth bank address latch signal BA_Lat<7> when the latch control signal Lat_c is disabled and the eighth rising pulse Dec_R<7> is enabled, that is, becomes a high level, and retains the enabled state of the eighth bank address latch signal BA_Lat<7> until the latch control signal Lat_c is enabled. Each of the first to eighth latch sections 221-3-1 to 221-3-8 may include, for example but not limited to, an set-reset (SR) latch circuit.

Referring to FIG. 6, the latch control section 221-4 may output a falling pulse which is generated latest among the first to eighth falling pulses Dec_F<0:7>, as the latch control signal Lat_c, or output the second refresh mode signal REF_a as the latch control signal Lat_c. For example, the latch control section 221-4 generates the latch control signal Lat_c in response to the first to eighth falling pulses Dec_F<0:7> and the address increase determination signal RRA_d. The latch control section 221-4 outputs a falling pulse among the first to eighth falling pulses Dec_F<0:7>, the enable period of which overlaps with the enable period of the address increase determination signal RRA_d, as the latch control signal Lat_c. Also, the latch control section 221-4 outputs the second refresh mode signal REF_a as the latch control signal Lat_c.

The latch control section 221-4 may include first and second NOR gates NOR1 and NOR2, first to third inverters IV1, IV2 and IV3, and a first NAND gate ND1. The first NOR gate NOR1 may be inputted with or receive the first to eighth falling pulses Dec_F<0:7>. The first inverter IV1 may be inputted with or receive the output signal of the first NOR gate NOR1, and may output a falling signal F_s. The first NAND gate ND1 may be inputted with or receive the address increase determination signal RRA_d and the falling signal F_s. The second inverter IV2 may be inputted with or receive the output signal of the first NAND gate ND1. The second NOR gate NOR2 may be inputted with or receive the output signal of the second inverter IV2 and the second refresh mode signal REF_a. The third inverter IV3 may be inputted with or receive the output signal of the second NOR gate NOR2, and may output the latch control signal Lat_c.

Referring to FIG. 7, the respective first to eighth pulse generating sections 221-2-1 to 221-2-8 have the same configurations except that their input signals and output signals are different. As such, the following descriptions for the configuration of the first pulse generating section 221-2-1 will replace the descriptions for the configurations of the remaining pulse generating sections 221-2-2 to 221-2-8.

Referring now to FIG. 9, the first pulse generating section 221-2-1 may include a delay part 221-2-1-1, fourth and fifth inverters IV4 and IV5, a second NAND gate ND2, and a third NOR gate NOR3. The delay part 221-2-1-1 may be inputted with or receive the first bank detection signal BA_dec<0>. The fourth inverter IV4 may be inputted with or receive the output signal of the delay part 221-2-1-1. The second NAND gate ND2 may be inputted with or receive the first bank detection signal BA_dec<0> and the output signal of the fourth inverter IV4. The fifth inverter IV5 may be inputted with or receive the output signal of the second NAND gate ND2, and output the first rising pulse Dec_R<0>. The third NOR gate NOR3 may be inputted with or receive the first bank detection signal BA_dec<0> and the output signal of the fourth inverter IV4, and output the first falling pulse Dec_F<0>.

The first pulse generating section 221-2-1 may generate the first rising pulse Dec_R<0> which may be enabled at the rising timing of the first bank detection signal BA_dec<0>. The first pulse generating section 221-2-1 may generate the first falling pulse Dec_F<0> which may be enabled at the falling timing of the first bank detection signal BA_dec<0>.

Figure 10:
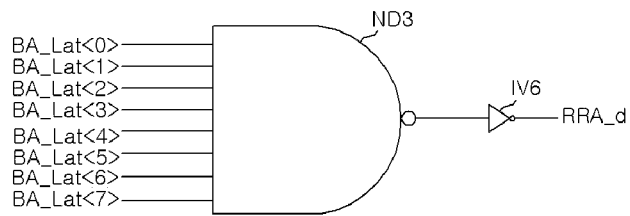
FIG. 10 is a configuration diagram of a representation of the row address increase control unit illustrated in FIG. 5.

Referring to FIG. 10, the row address increase control unit 222 illustrated in FIG. 5 may enable the address increase determination signal RRA_d when all the first to eighth bank address latch signals BA_Lat<0:7> are enabled. The row address increase control unit 222 may generate the address increase determination signal RRA_d which has an enable period overlapping with all the enable periods of the first to eighth bank address latch signals BA_Lat<0:7>.

The row address increase control unit 222 may include a third NAND gate ND3 and a sixth inverter IV6. The third NAND gate ND3 may be inputted with or receive the first to eighth bank address latch signals BA_Lat<0:7>. The sixth inverter IV6 may be inputted with or receive the output signal of the third NAND gate ND3, and output the address increase determination signal RRA_d.

Figure 11:
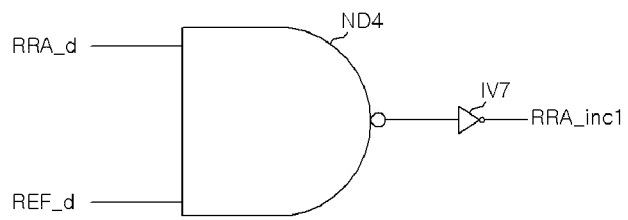
FIG. 11 is a configuration diagram of a representation of the row address increase signal generation unit illustrated in FIG. 5.

The row address increase signal generation unit 224 illustrated in FIG. 5 may enable the first row address increase signal RRA_inc1 when both the address increase determination signal RRA_d and the delayed signal REF_d are enabled. Referring to FIG. 11, the row address increase signal generation unit 224 may include a fourth NAND gate ND4 and a seventh inverter IV7. The fourth NAND gate ND4 may be inputted with or receive the address increase determination signal RRA_d and the delayed signal REF_d. The seventh inverter IV7 may be inputted with or receive the output signal of the fourth NAND gate ND4, and output the first row address increase signal RRA_inc1.

Operations of the semiconductor memory apparatus in accordance with the embodiments, configured as mentioned above, will be described below with reference to FIG. 12.

Figure 12:
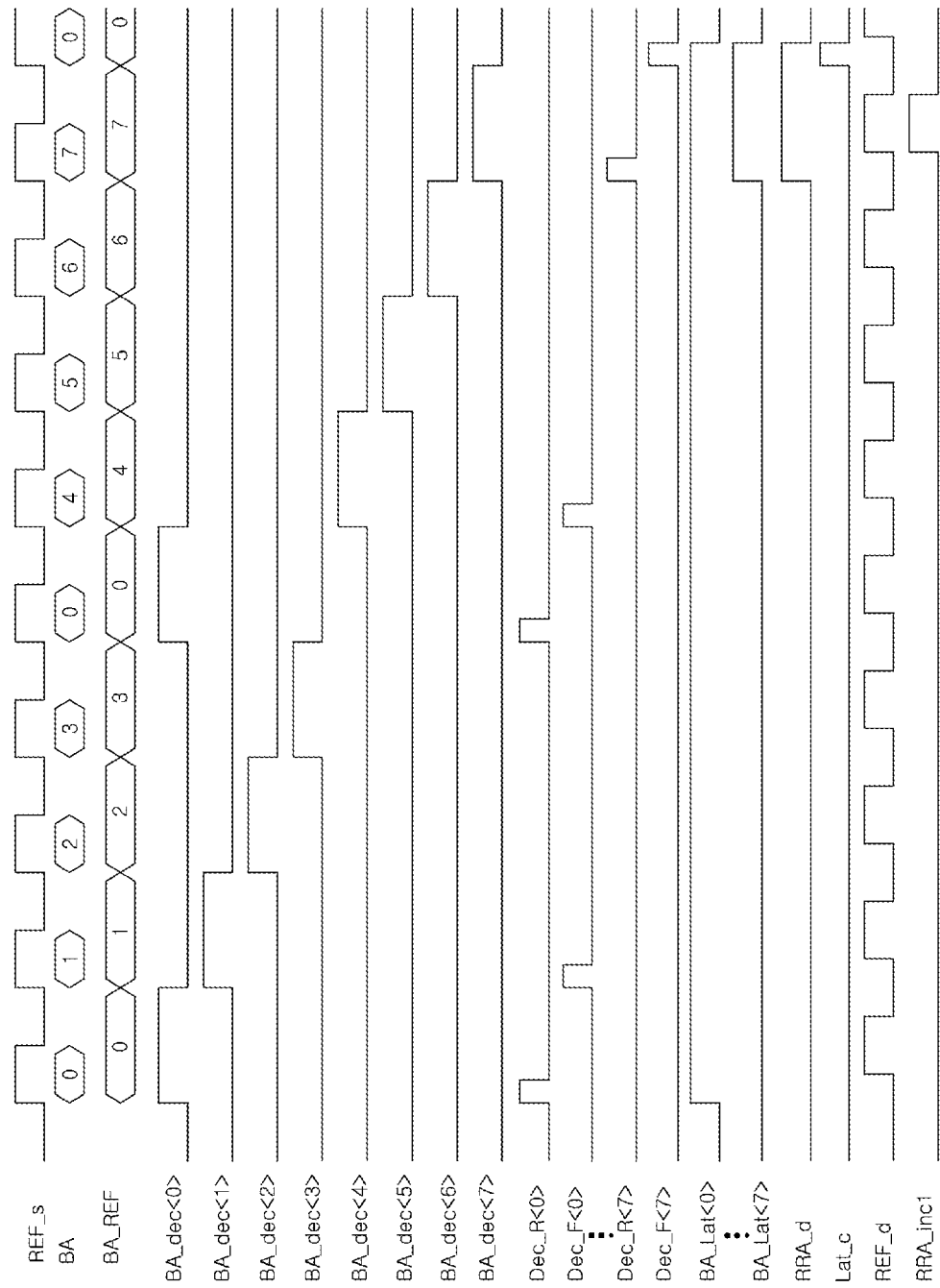
FIG. 12 is a timing diagram for explaining operations of the semiconductor memory apparatus in accordance with the embodiments.

For example, referring to FIG. 12, the bank address BA<0:2> is denoted by decimal numbers. It is meant that, if BA is 0, the bank address BA<0:2> has the value of 0,0,0, and if BA is 1, the bank address BA<0:2> has the value of 0,0,1, etc.

If the command CMD is a refresh command and the refresh control signal REF_c is enabled, the first refresh mode signal REF_s is enabled. As the command CMD as a refresh command is consecutively inputted in the state in which the refresh control signal REF_c is enabled, the first refresh mode signal REF_s is enabled repeatedly as illustrated in FIG. 12.

The bank address generation block 210 of FIG. 3 latches the bank address BA<0:2> each time the first refresh mode signal REF_s is enabled, and outputs the bank address BA_REF<0:2>.

The comparison group 221-1 of FIG. 6 compares the bank address BA_REF<0:2> with the respective first to eighth fixed codes F_c0<0:2> to F_c7<0:2>, and generates the first to eighth bank detection signals BA_dec<0:7>. The first to eighth fixed codes F_c0<0:2> to F_c7<0:2> have the values of 0,0,0 to 1,1,1.

Thus, the comparison group 221-1 enables the first bank detection signal BA_dec<0> when the bank address BA_REF<0:2> has the value of 0,0,0 (0 as a decimal number). The comparison group 221-1 enables the second bank detection signal BA_dec<1> when the bank address BA_REF<0:2> has the value of 0,0,1 (a decimal number of 1). The comparison group 221-1 enables the third bank detection signal BA_dec<2> when the bank address BA_REF<0:2> has the value of 0,1,0 (a decimal number of 2). The comparison group 221-1 enables the fourth bank detection signal BA_dec<3> when the bank address BA_REF<0:2> has the value of 0,1,1 (a decimal number of 3). The comparison group 221-1 enables the fifth bank detection signal BA_dec<4> when the bank address BA_REF<0:2> has the value of 1,0,0 (a decimal number of 4). The comparison group 221-1 enables the sixth bank detection signal BA_dec<5> when the bank address BA_REF<0:2> has the value of 1,0,1 (a decimal number of 5). The comparison group 221-1 enables the seventh bank detection signal BA_dec<6> when the bank address BA_REF<0:2> has the value of 1,1,0 (a decimal number of 6). The comparison group 221-1 enables the eighth bank detection signal BA_dec<7> when the bank address BA_REF<0:2> has the value of 1,1,1 (a decimal number of 7).

The pulse generation group 221-2 generates the first to eighth rising pulses Dec_R<0:7> and the first to eighth falling pulses Dec_F<0:7> at the respective rising edges and falling edges of the first to eighth bank detection signals BA_dec<0:7>. In FIG. 12, only the first and eighth rising pulses Dec_R<0> and Dec_R<7> and the first and eighth falling pulses Dec_F<0> and Dec_F<7> are shown.

The latch group 221-3 enables the corresponding first to eighth bank address latch signals BA_Lat<0:7> when the respective first to eighth rising pulses Dec_R<0:7> are enabled. When the first to eighth bank address latch signals BA_Lat<0:7> are enabled, the latch group 221-3 retains the enabled states of the first to eighth bank address latch signals BA_Lat<0:7> until the latch control signal Lat_c is enabled.

The row address increase control unit 222 of FIG. 5 generates the address increase determination signal RRA_d which has the enable period overlapping with all the enable periods of the first to eighth bank address latch signals BA_Lat<0:7>. That is to say, the row address increase control unit 222 enables the address increase determination signal RRA_d when all the first to eighth bank address latch signals BA_Lat<0:7> are enabled.

In other words, the row address increase control unit 222 of FIG. 5 outputs a bank address latch signal (the eighth bank address latch signal BA_Lat<7> in FIG. 12) which is enabled latest among the first to eighth bank address latch signals BA_Lat<0:7>, as the address increase determination signal RRA_d.

The latch control section 221-4 of FIG. 6 outputs a falling pulse (the eighth falling pulse Dec_F<7> generated latest, in FIG. 12) which is generated in the enable period of the address increase determination signal RRA_d among the first to eighth falling pulses Dec_F<0:7>, as the latch control signal Lat_c.

If the latch control signal Lat_c is enabled, all the first to eighth bank address latch signals BA_Lat<0:7> are disabled.

The row address increase signal generation unit 224 illustrated in FIG. 5 enables the first row address increase signal RRA_inc1 when both the delayed signal REF_d and the address increase determination signal RRA_d are enabled. Namely, the row address increase signal generation unit 224 outputs the delayed signal REF_d which has an enable period overlapping with the enable period of the address increase determination signal RRA_d, as the first row address increase signal RRA_inc1.

Referring to FIG. 12, it may be seen that the bank address BA<0:2> becomes 0 after increasing from 0 to 3 and then increases from 4 to 7.

In the semiconductor memory apparatus in accordance with the embodiments, when the bank address BA<0:2> has initially the value of 0, the first bank address latch signal BA_Lat<0> is enabled and retained, and therefore, even though the bank address BA<0:2> has again the value of 0, the first bank address latch signal BA_Lat<0> retains the enabled state. That is to say, in the semiconductor memory apparatus in accordance with the embodiments, even though a bank address has a repeated value, set values are all satisfied, and, when a bank address which has a value set latest is inputted, the first row address increase signal RRA_inc1 is enabled. If the first row address increase signal RRA_inc1 is enabled, the row address generation circuit 400 illustrated in FIG. 1 increases the value of the row address RRA<0:N>.

The operations of the semiconductor memory apparatus in accordance with the embodiments may be summarized, for example, as follows.

When the command CMD is a refresh command, the first refresh mode signal REF_s and the second refresh mode signal REF_a are selectively enabled according to the refresh control signal REF_c. The first refresh mode signal REF_s is to refresh a bank which is designated by the bank address BA<0:2>, and the second refresh mode signal REF_a is to refresh simultaneously or substantially simultaneously all banks. Thus, each time the second refresh mode signal REF_a is enabled, the second refresh mode control circuit 300 enables the second row address increase signal RRA_inc2 and increases the row address RRA<0:N>. Also, the first refresh mode signal REF_s enables the first row address increase signal RRA_inc1 and increases the row address RRA<0:N>, after the bank address BA<0:2> designates all banks. For example, a refresh operation by the first refresh mode signal REF_s is performed in such a manner that refresh operations are performed sequentially for the same row addresses of all banks, a row address is increased, and then refresh operations are performed sequentially again for the same row addresses of all the banks. While the refresh operation by the first refresh mode signal REF_s is performed, a repeated bank address does not exert any influence on the refresh operation. As a consequence, the semiconductor memory apparatus in accordance with the embodiments may perform a stable refresh operation.

Figure 13:
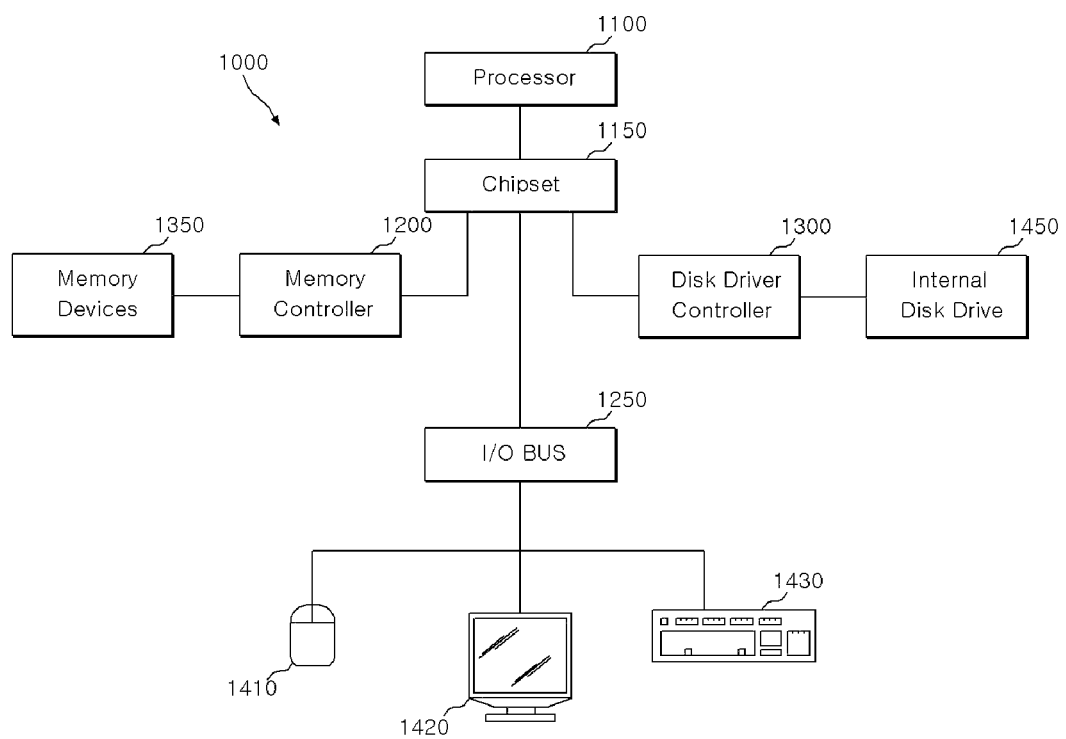
FIG. 13 illustrates a block diagram of an example of a representation of a system employing the semiconductor memory apparatus or generally a semiconductor integrated circuit in accordance with the embodiments discussed above with relation to FIGS. 1-12.

The semiconductor memory apparatus as discussed above (see FIGS. 1-12) or generally a semiconductor integrated circuit are particular useful in the design of memory devices, processors, and computer systems. For example, referring to FIG. 13, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-12 or generally a semiconductor integrated circuit. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-12 or generally a semiconductor integrated circuit, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 13 is merely one example of a system employing the semiconductor memory apparatus as discussed above with relation to FIGS. 1-12. In alternate embodiments, such as cellular phones or digital cameras, the components may differ from the embodiments illustrated in FIG. 13.

While various embodiments have been described above, it will be understood to those skilled in the art that the embodiments described are by way of example only. Accordingly, the semiconductor memory apparatus described herein should not be limited based on the described embodiments.

What is claimed is:
1. A semiconductor memory apparatus comprising:
   a refresh mode selection circuit configured to generate a first refresh mode signal and a second refresh mode signal in response to an external command and a refresh control signal;

a first refresh mode control circuit configured to receive a bank address and generate a first row address increase signal in response to the bank address and the first refresh mode signal;
a second refresh mode control circuit configured to generate a second row address increase signal in response to the second refresh mode signal; and
a row address generation circuit configured to generate a row address in response to the first and second row address increase signals,
wherein the first refresh mode control circuit enables the first row address increase signal after all preset banks to be designated by the bank addresses are activated, when the first refresh mode signal is enabled,
wherein the bank address comes from a memory controller and is generated randomly by the memory controller.

2. The semiconductor memory apparatus according to claim 1, wherein the refresh mode selection circuit comprises:
a decoding block configured for receiving an external command and outputting a refresh signal; and
a selective output block configured for receiving the refresh signal and the refresh control signal and outputting the first refresh mode signal and the second refresh mode signal,
wherein when the external command is a refresh command and the refresh control signal is enabled the first refresh mode signal is enabled placing the semiconductor memory apparatus in a single bank refresh mode, and
wherein when the external command is a refresh command and the refresh control signal is disabled the second refresh mode signal is enabled placing the semiconductor memory apparatus in a all bank refresh mode.

3. The semiconductor memory apparatus according to claim 2, wherein in the single bank refresh mode a refresh operation is performed for the row address of the bank designated by the bank address and the refresh operation is performed again after increasing the row address.

4. The semiconductor memory apparatus according to claim 2, wherein in the all bank refresh mode a refresh operation is performed simultaneously for all preset banks to be designated by the bank addresses.

5. The semiconductor memory apparatus according to claim 2, wherein the selective output block includes a demultiplexer.

6. The semiconductor memory apparatus according to claim 1, wherein the first refresh mode control circuit comprises:
a bank address generation block configured to latch the bank address when the first refresh mode signal is enabled, and output the latched bank address as a bank address; and
a row address control block configured to enable the first row address increase signal when a value of the bank address corresponds to all values of a plurality of preset fixed codes, when the first refresh mode signal is enabled.

7. The semiconductor memory apparatus according to claim 6, wherein the bank address generation block comprises a plurality of latch units which latch respective bits of the bank address when the first refresh mode signal is enabled and output the latched bits as respective bits of the bank address.

8. The semiconductor memory apparatus according to claim 6, wherein the row address control block comprises:
a bank address comparison unit configured to determine whether the values of the bank addresses and the plurality of preset fixed codes are the same, and generate a plurality of bank address latch signals;
a row address increase control unit configured to enable an address increase determination signal in response to the plurality of bank address latch signals;
a delay unit configured to delay the first refresh mode signal and generate a delayed signal; and
a row address increase signal generation unit configured to enable the first row address increase signal when both the address increase determination signal and the delayed signal are enabled.

9. The semiconductor memory apparatus according to claim 8,
wherein the bank address comparison unit enables, latches and outputs a corresponding bank address latch signal among the plurality of bank address latch signals when the values of the bank addresses and the plurality of preset fixed codes are the same with each other, and
wherein the bank address comparison unit disables all the plurality of bank address latch signals after all the plurality of bank address latch signals are enabled and the address increase determination signal is enabled.

10. The semiconductor memory apparatus according to claim 9, wherein the bank address comparison unit comprises:
a comparison group including a plurality of comparing sections which are configured to compare values of the bank addresses and respective values of the plurality of preset fixed codes and generate a plurality of bank detection signals;
a pulse generation group including a plurality of pulse generating sections which are configured to generate a plurality of rising pulses and a plurality of falling pulses at rising edges and falling edges of the plurality of respective bank detection signals;
a latch group including a plurality of latch sections which are configured to latch respective enable periods of the plurality of rising pulses according to a latch control signal and output the plurality of bank address latch signals; and
a latch control section configured to output a falling pulse which is generated latest among the plurality of falling pulses, as the latch control signal, in response to the address increase determination signal.

11. The semiconductor memory apparatus according to claim 10, wherein the plurality of latch sections latch the enable periods of the rising pulses and output the bank address latch signals when the latch control signal is disabled, and initialize values latched therein when the latch control signal is enabled.

12. The semiconductor memory apparatus according to claim 8, wherein the row address increase control unit enables the address increase determination signal when all of the plurality of bank address latch signals are enabled.

13. A semiconductor memory apparatus comprising:
a refresh mode control circuit configured to receive a bank address and enable a row address increase signal when all banks capable of being designated the bank address in a refresh operation are all designated; and
a row address generation circuit configured to increase a value of a row address when the row address increase signal is enabled, wherein the bank address comes from a memory controller and is generated randomly by the memory controller.

14. The semiconductor memory apparatus according to claim 13, wherein the refresh mode control circuit comprises:
   a bank address generation block configured to latch the bank address each time a refresh mode signal is enabled, and generate a bank address; and
   a row address control block configured to generate the row address increase signal in response to the bank address and the refresh mode signal.

15. The semiconductor memory apparatus according to claim 14, wherein the row address control block comprises:
   a bank address comparison unit configured to compare the bank address and a plurality of fixed codes, and generate a plurality of bank address latch signals;
   a row address increase control unit configured to enable an address increase determination signal when all of the plurality of bank address latch signals are enabled;
   a delay unit configured to delay the refresh mode signal and generate a delayed signal; and
   a row address increase signal generation unit configured to enable the row address increase signal when both the delayed signal and the address increase determination signal are enabled.

16. The semiconductor memory apparatus according to claim 15, wherein the bank address comparison unit enables a corresponding bank address latch signal among the plurality of bank address latch signals each time the bank address corresponds to the plurality of respective fixed codes, and retains the enabled bank address latch signal until the address increase determination signal is enabled.

17. The semiconductor memory apparatus according to claim 16, wherein the bank address comparison unit comprises:
   a comparison group including a plurality of comparing sections which are configured to compare the bank address and the plurality of respective fixed codes and generate a plurality of bank detection signals;
   a pulse generation group including a plurality of pulse generating sections which are configured to generate a plurality of rising pulses and a plurality of falling pulses at rising edges and falling edges of the plurality of respective bank detection signals;
   a latch group including a plurality of latch sections which are configured to latch enable levels of the plurality of rising pulses and output the plurality of bank address latch signals, and disable all of the plurality of bank address latch signals in response to a latch control signal; and
   a latch control section configured to output a falling pulse which has an enable period overlapping with an enable period of the address increase determination signal among the plurality of falling pulses, as the latch control signal, or output a second refresh mode signal as the latch control signal.

18. A semiconductor memory apparatus including:
   a decoding block configured for receiving an external command and outputting a refresh signal;
   a selective output block configured for receiving the refresh signal and a refresh control signal and outputting a first refresh mode signal and a second refresh mode signal; and
   a refresh mode control circuit configured to receive a bank address and enable a row address increase signal when all banks capable of being designated by the bank address in a refresh operation are all designated,
   wherein when the external command is a refresh command and the refresh control signal is enabled the first refresh mode signal is enabled placing the semiconductor memory apparatus in a single bank refresh mode, and
   wherein in the single bank refresh mode the refresh operation is performed for the row address of a bank designated by the bank address and the refresh operation is performed again for another row address after increasing the row address,
   wherein the bank address comes from a memory controller and is generated randomly by the memory controller.

19. The semiconductor memory apparatus according to claim 18,
   wherein when the external command is a refresh command and the refresh control signal is disabled a second refresh mode signal is enabled placing the semiconductor memory apparatus in an all bank refresh mode, and
   wherein in the all bank refresh mode a refresh operation is performed simultaneously for all preset banks to be designated by bank addresses.

* * * * *